(12) United States Patent
Borland

(10) Patent No.: US 7,072,167 B2
(45) Date of Patent: Jul. 4, 2006

(54) CO-FIRED CERAMIC CAPACITOR AND METHOD FOR FORMING CERAMIC CAPACITORS FOR USE IN PRINTED WIRING BOARDS

(75) Inventor: William J. Borland, Cary, NC (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 10/878,877

(22) Filed: Jun. 28, 2004

(65) Prior Publication Data

US 2004/0233611 A1   Nov. 25, 2004

Related U.S. Application Data

(62) Division of application No. 10/651,367, filed on Aug. 29, 2003.

(60) Provisional application No. 60/418,045, filed on Oct. 11, 2002.

(51) Int. Cl.
  *H01G 4/005* (2006.01)
(52) U.S. Cl. ............... 361/302; 361/303; 361/306.1; 361/306.2; 361/321.2; 361/311; 361/313; 438/400; 438/243; 438/250
(58) Field of Classification Search ........ 361/302–303, 361/305, 321.1, 321.5, 306.1, 306.3, 311, 361/313, 328, 321.2; 438/400, 243, 250
See application file for complete search history.

(56) References Cited

U.S. PATENT DOCUMENTS

| | | | |
|---|---|---|---|
| 4,063,341 A | 12/1977 | Bouchard et al. | |
| 4,190,854 A | 2/1980 | Redfern | |
| 4,526,613 A | 7/1985 | Stetson et al. | |
| 5,208,597 A * | 5/1993 | Early et al. | 341/172 |
| 5,256,469 A | 10/1993 | Cherukuri et al. | |
| 5,509,200 A | 4/1996 | Frankeny et al. | |
| 5,557,843 A | 9/1996 | McKenney et al. | |
| 6,317,023 B1 | 11/2001 | Felten | |
| 6,370,013 B1 * | 4/2002 | Iino et al. | 361/306.3 |
| 6,426,250 B1 * | 7/2002 | Lee et al. | 438/239 |
| 6,525,921 B1 * | 2/2003 | Nakatani et al. | 361/306.3 |
| 6,631,551 B1 | 10/2003 | Bowles et al. | |
| 6,703,705 B1 * | 3/2004 | Yamazaki et al. | 257/692 |
| 2001/0005304 A1 | 6/2001 | Appelt et al. | |
| 2001/0008479 A1 | 7/2001 | Branchevsky | |
| 2002/0179329 A1 * | 12/2002 | Fukuoka et al. | 174/260 |

(Continued)

FOREIGN PATENT DOCUMENTS

DE  100 42 653 A   3/2002

(Continued)

OTHER PUBLICATIONS

John Felten and Saul Ferguson, Embedded Ceramic Resistors and Capacitors for PWB, IP Printed Circuit Expo, San Diego, CA, Apr. 2000.

(Continued)

*Primary Examiner*—Nguyen T. Ha

(57) ABSTRACT

A capacitor structure is fabricated by forming a pattern of first dielectrics over a foil, forming first electrodes over the first dielectrics, and co-firing the first dielectrics and the first electrodes. Co-firing of the dielectrics and the electrodes alleviates cracking caused by differences in thermal coefficient of expansion (TCE) between the electrodes and the dielectrics. Co-firing also ensures a strong bond between the dielectrics and the electrodes. In addition, co-firing allows multi-layer capacitor structures to be constructed, and allows the capacitor electrodes to be formed from copper.

13 Claims, 5 Drawing Sheets

U.S. PATENT DOCUMENTS

2003/0154592 A1   8/2003   Felten

FOREIGN PATENT DOCUMENTS

| EP | 1 003 216 A2 | 5/2000 |
|---|---|---|
| JP | 2-125692 | 5/1990 |
| JP | 2-153589 | 6/1990 |
| JP | 8-279669 | 10/1996 |
| JP | 2001-168491 | 12/1999 |
| JP | 2003-92460 | 5/2002 |
| WO | WO 00/45624 | 8/2000 |

OTHER PUBLICATIONS

John J. Felten and Saul Ferguson, Ceramic Resistors and Capacitors Embeddedd in PWB, IPC, San Diego, Apr. 5, 2000.

John J. Felten and Saul Ferguson, Ceramic Resistors and Capacitors Embedded in PWB, IMAPS, Denver, Apr. 29, 2000.

John J. Felten and William J. Borland, Embedded Ceramic Passives in PWB: Process Development, IPC Printed Circuit Expo, Anaheim, CA, Apr. 2001.

John J. Felten and William J. Borland, Ceramic Resistors and Capacitors Embedded in PWB's, IPC Expo, Apr. 3, 2001.

William Borland, Designing for Embedded Passives, Printed Circuit Design, Aug. 2001.

William Borland, John J. Felten, Thick Film Ceramic Capacitors and Resistors inside Printed Circuit Boards, 34th International Symposium on Microelectronics (IMAPS), Oct. 9-11, 2001, Baltimore, MD.

John Felten, Richard Snogren, Jiming Zhou, Embedded Ceramic Resistors and Capacitors in PWB: Process and Performance, Fall IPC Meeting, Oct. 11, 2001, Orlando, FL.

William J. Borland and Saul Ferguson, Embedded Passive Components in Printed Wiring Boards, a.Technology Review, To be published in CircuiTree Magazine, 2001.

Jiming Zhou, John D. Myers and John J. Felten, Embedded Passives Technology for PCBs: Materials, Design, and Process, IMAPS 2002 Conference, Denver, CO, Sep. 4-6, 2002.

John J. Felten, Electronic Circuits World Convention, Paper No. IPC31, Advanced Embedded Passives Technologies—Putting Ceramic Components into Organic PWBs.

William Borland, John J. Felten, Saul Ferguson, Alton B. Jones and Angela A. Lawrence, Embedded Singulated Ceramic Passives in Printed Wiring Boards, IMAPS Advanced Technology Workshop on Passive Integration, Ogunquit, ME, Jun. 19-21, 2002.

Dr. Kim Fjeldsted and Stacey L. Chase, Embedded Passives: Laser Trimmed Resistors, Circuitree, vol. 70, Mar. 2002.

* cited by examiner

CO-FIRED CERAMIC CAPACITOR AND METHOD FOR FORMING CERAMIC CAPACITORS FOR USE IN PRINTED WIRING BOARDS

CROSS-REFERENCE TO RELATED DOCUMENT

The present application is a division and claims the benefit of U.S. application Ser. No. 10/651,367, filed Aug. 29, 2003, which claims the benefit of Provisional Application 60/418,045, filed on Oct. 11, 2002.

BACKGROUND

1. Technical Field

The technical field is ceramic capacitors. More particularly, the technical field includes co-fired ceramic capacitors that may be embedded in printed wiring boards.

2. Background Art

Passive circuit components embedded in printed wiring boards formed by fired-on-foil technology are known. Known components are separately fired-on-foil. "Separately fired-on-foil" capacitors are formed by depositing a thick-film dielectric material layer onto a metallic foil substrate and firing under thick-film firing conditions, and subsequently depositing a top electrode material over the thick-film dielectric material layer. U.S. Pat. No. 6,317,023 B1 to Felten discloses such a process.

The thick-film dielectric material should have a high dielectric constant (K) after firing. A high K thick-film dielectric is formed by mixing a high dielectric constant K powder (the "functional phase") with a glass powder and dispersing the mixture into a thick-film screen-printing vehicle. High K glasses can be wholly or partially crystalline, depending on their composition and the amount of high K crystal they precipitate. These glasses are often termed "glass-ceramics."

During firing of the thick-film dielectric material, the glass component of the dielectric material softens and flows before the peak firing temperature is reached, coalesces, encapsulates the functional phase, and subsequently crystallizes, forming the glass-ceramic. The glass-ceramic, however, does not re-soften and flow on subsequent firings, and its surface is often difficult to adhere to.

Silver and silver-palladium alloys are preferred metals for forming capacitor electrodes because of their relatively small differences in thermal coefficient of expansion (TCE) from the dielectrics used in fired-on-foil capacitors. Small TCE differences result in low stress in the electrode upon cooling from peak firing temperatures. However, silver and silver-containing alloys may be undesirable in some applications because of the possibility of silver migration. In addition, the relatively low melting points of silver and silver alloys preclude their use at higher firing temperatures.

Copper is a preferred material for forming electrodes, but the large TCE differences between copper and thick-film capacitor dielectrics lead to post-firing stresses in the electrodes. The stresses result in electrode cracking. In addition, because pre-fired glass ceramics do not re-soften and flow on subsequent firings, a copper electrode fired on a pre-fired glass-ceramic surface may not adhere well to the glass-ceramic. The electrode may therefore separate from the dielectric. Both cracking and separation result in high dissipation factors.

SUMMARY

According to a first embodiment, a method for making a fired-on-foil ceramic capacitor structure comprises forming first dielectrics over a metallic foil, forming first electrodes over the first dielectrics, and co-firing the first dielectrics and the first electrodes. In the first embodiment, cracking and separation of the electrode from the dielectric caused by differences in thermal coefficient of expansion (TCE) between the electrodes and the dielectrics is avoided by co-firing the electrodes and the dielectrics. Alleviation of the TCE problem also allows the use of preferred materials, such as copper, to form the electrodes.

According to a second embodiment, a two-layer capacitor structure comprises a metallic foil, dielectrics disposed over the foil, first electrodes disposed over the first dielectrics, and second electrodes disposed over the dielectrics and over the first electrodes. In the second embodiment, the capacitance density of the capacitor structure is increased because of the additional dielectric/electrode layer. Additional layers may also be added, further increasing capacitance density. Also according to the second embodiment, the capacitor structure may comprise a copper foil and copper electrodes.

BRIEF DESCRIPTION OF THE DRAWINGS

The detailed description will refer to the following drawings, wherein like numerals refer to like elements, and wherein.

DETAILED DESCRIPTION

FIGS. 1A–1D illustrate a general method of manufacturing a capacitor structure 100 (FIG. 1E) having a single-layer capacitor on metallic foil design. FIG. 1E is a plan view of the finished capacitor structure 100. Specific examples of the capacitor structure 100 are also described below.

Figure 1A:
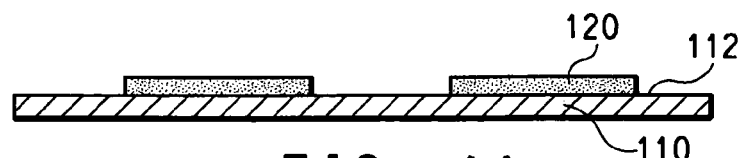
FIGS. 1A to 1D schematically illustrate steps in manufacturing a first embodiment of a capacitor structure shown in front elevation.

FIG. 1A is a side elevational view of first stage of manufacturing the capacitor structure 100. In FIG. 1A, a metallic foil 110 is provided. The foil 110 may be of a type generally available in the industry. For example, the foil 110 may be copper, copper-invar-copper, invar, nickel, nickel-coated copper, or other metals that have melting points in excess of the firing temperature for thick film pastes. Preferred foils include foils comprised predominantly of copper, such as reverse treated copper foils, double-treated copper foils, and other copper foils commonly used in the multilayer printed circuit board industry. The thickness of the foil 110 may be in the range of, for example, about 1–100 microns, preferably 3–75 microns, and most preferably 12–36 microns, corresponding to between about ⅓ oz and 1 oz copper foil.

The foil 110 may be pretreated by applying an underprint 112 to the foil 110. The underprint 112 is a relatively thin layer applied to a component-side surface of the foil 110. In FIG. 1A, the underprint 112 is indicated as a surface coating on the foil 110. The underprint 112 adheres well to the metal foil 110 and to layers deposited over the underprint 112. The underprint 112 may be formed, for example, from a paste applied to the foil 110, and is then fired at a temperature below the softening point of the foil 110. The paste may be printed as an open coating over the entire surface of the foil 110, or printed on selected areas of the foil 110. It is generally more economical to print the underprint paste over selected areas of the foil. When a copper foil 110 is used in conjunction with a copper underprint 112, glass in the copper underprint paste retards oxidative corrosion of the copper foil 110, and it may therefore be preferable to coat the entire surface of the foil 110 if oxygen-doped firing is utilized.

Figure 1B:
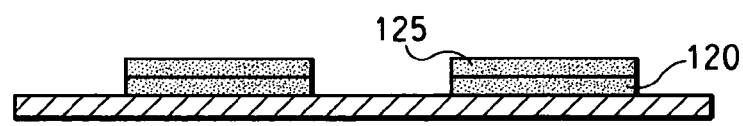

In FIG. 1A, a dielectric material is screen-printed onto the pretreated foil 110, forming a first dielectric layer 120. The dielectric material may be, for example, a thick-film dielectric ink. The dielectric ink may be formed of, for example, a paste. The first dielectric layer 120 is then dried. In FIG. 1B, a second dielectric layer 125 is then applied, and dried. In an alternative embodiment, a single layer of dielectric material may be deposited through a coarser mesh screen to provide an equivalent thickness in one printing.

Figure 1C:
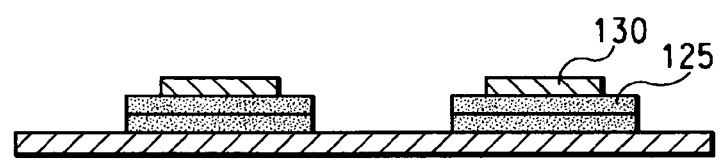
Figure 1D:
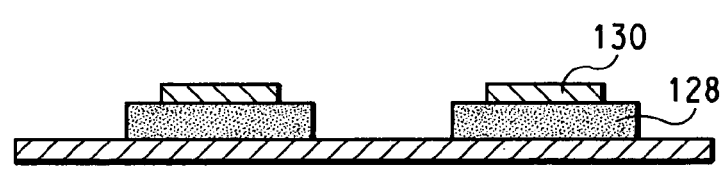
Figure 1E:
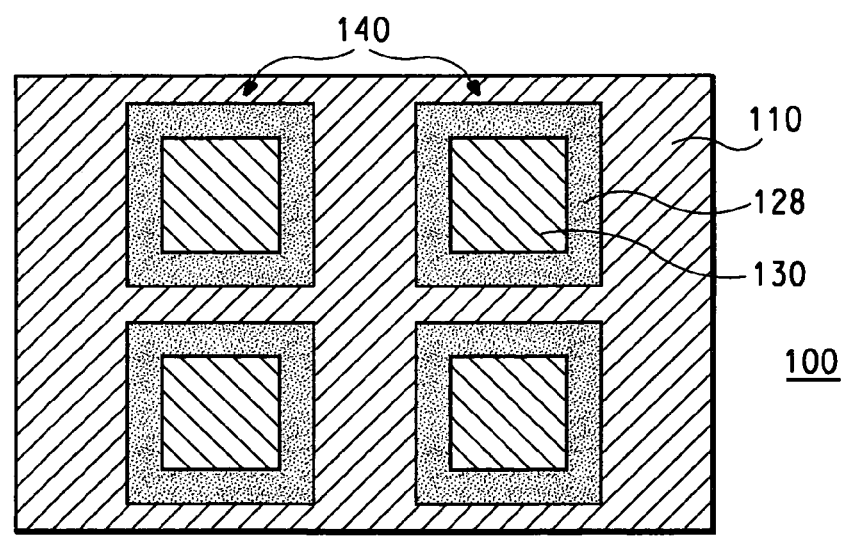
FIG. 1E is a top plan view of the first capacitor structure embodiment.

In FIG. 1C, an electrode 130 is formed over the second dielectric layer 125 and dried. The electrode 130 can be formed by, for example, screen-printing a thick-film metallic ink. In general, the surface area of the dielectric layer 125 should be larger than that of the electrode 130.

The first dielectric layer 120, the second dielectric layer 125, and the electrode 130 are then co-fired. The thick-film dielectric layers 120, 125 may be formed of, for example, a high dielectric constant functional phase such as barium titanate and a dielectric property-modifying additive such as zirconium dioxide, mixed with a glass-ceramic frit phase. During co-firing, the glass-ceramic frit phase softens, wets the functional and additive phases and coalesces to create a dispersion of the functional phase and the modifying additive in a glass-ceramic matrix. At the same time, the copper electrode powders of the layer 130 are wetted by the softened glass-ceramic frit phase and sinter together to form a solid electrode. The layer 130 has a strong bond to the high K dielectric 128 that results from the co-firing. The post-fired structure is shown in front elevation in FIG. 1D.

FIG. 1E is a plan view of the finished capacitor structure 100. In FIG. 1E, four dielectric/electrode stacks 140 on the foil 110 are illustrated. Any number of stacks 140, in various patterns, however, can be arranged on a foil 110 to form the capacitor structure 100.

Examples 1–3 illustrate particular materials and processes used in practicing the general method illustrated by FIGS. 1A–1E.

FIGS. 2A–2J illustrate a method of manufacturing a capacitor structure 200 having a double-layer capacitor on metallic foil design. FIG. 2K is a plan view of the finished capacitor structure 200.

Figure 2A:
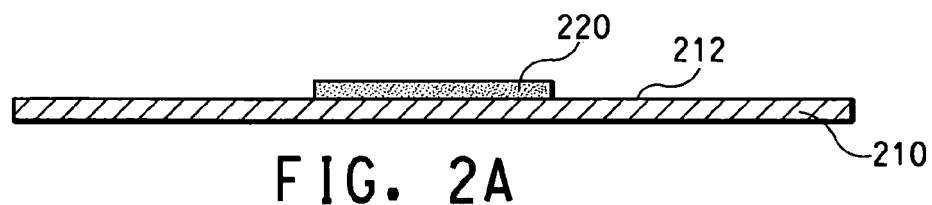
FIGS. 2A to 2J schematically illustrate steps in manufacturing a second embodiment of a capacitor structure shown in front elevation.

FIG. 2A is a front elevational view of first stage of manufacturing the capacitor structure 200. In FIG. 2A, a metallic foil 210 is provided. The foil 210 may be pretreated by applying and firing an underprint 212, as discussed above with reference to FIG. 1A. A dielectric material is screen-printed onto the pretreated foil 210, forming a first dielectric layer 220. The first dielectric layer 220 is then dried.

Figure 2B:
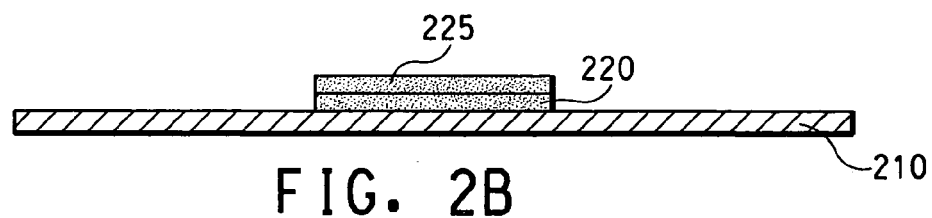

In FIG. 2B, a second dielectric layer 225 is then applied, and dried. A single layer of dielectric material may alternatively be used.

Figure 2C:
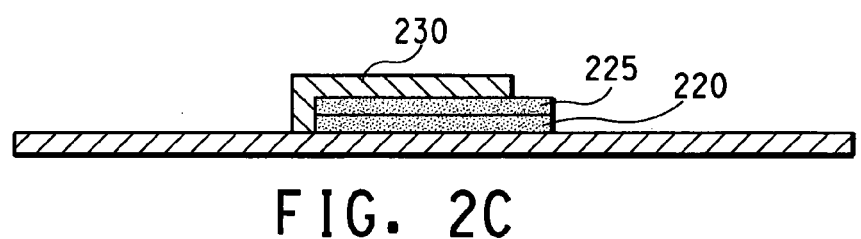

In FIG. 2C, a first electrode 230 is formed over the second dielectric layer 225 and dried. The first electrode may be formed by, for example, screen-printing a thick-film metallic ink. The first electrode 230 is formed to extend to contact the foil 210.

The first dielectric layer 220, the second dielectric layer 225, and the first electrode 230 are then co-fired. The dielectric layers 220, 225 may have similar compositions to the materials discussed above with reference to FIGS. 1A–1E, and the co-firing process imparts the advantages of adhesion and defect-free processing discussed above. A resulting dielectric 228 is formed from the co-firing step, as shown in FIG. 2D.

Figure 2D:
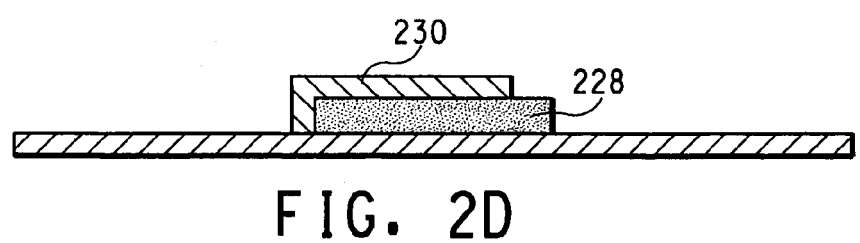
Figure 2E:
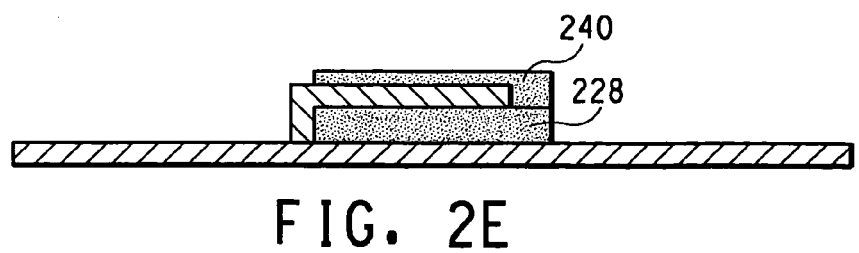
Figure 2F:
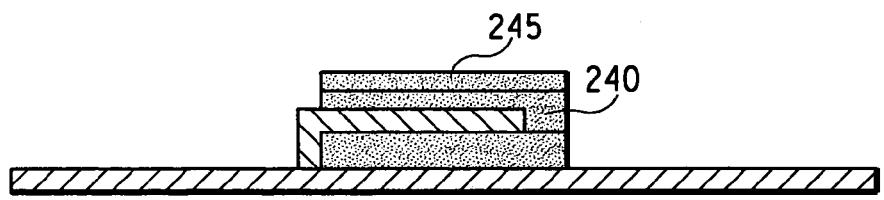

In FIG. 2E, a third layer of dielectric material is screen-printed onto the co-fired structure of FIG. 2D, forming a third dielectric layer 240. The third dielectric layer 240 is then dried. In FIG. 2F, a fourth dielectric layer 245 is applied and dried. A single layer of dielectric material may alternatively be used.

Figure 2G:
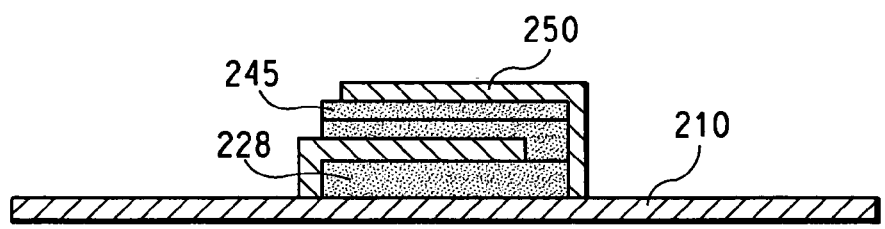
Figure 2H:
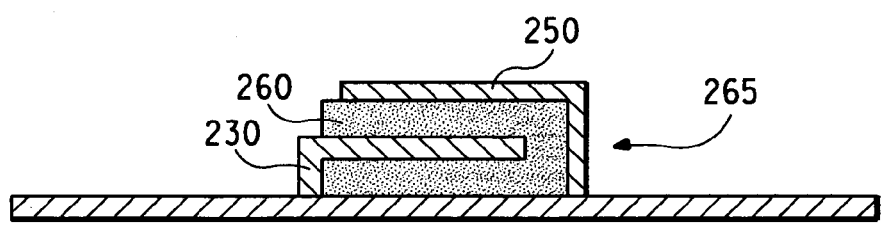

In FIG. 2G, a second electrode 250 is formed over the fourth dielectric layer 245 and dried. The second electrode 250 extends to contact the foil 210. The structure is then co-fired. FIG. 2H illustrates the structure after co-firing, with the resulting dielectric 260 and dielectric/electrode stack 265. After co-firing, the dielectric 260 securely adheres to both electrodes 230, 250, and the electrodes 230, 250 are crack-free.

As an alternative to two separate firing steps as discussed with reference to FIGS. 2D and 2H, a single co-firing can be performed after forming the second electrode 250. A single co-firing is advantageous in that production costs are reduced. Two separate firings, however, allow inspection of the first electrode 230 for defects such as cracks and for printing alignment issues after the first firing.

Figure 2I:
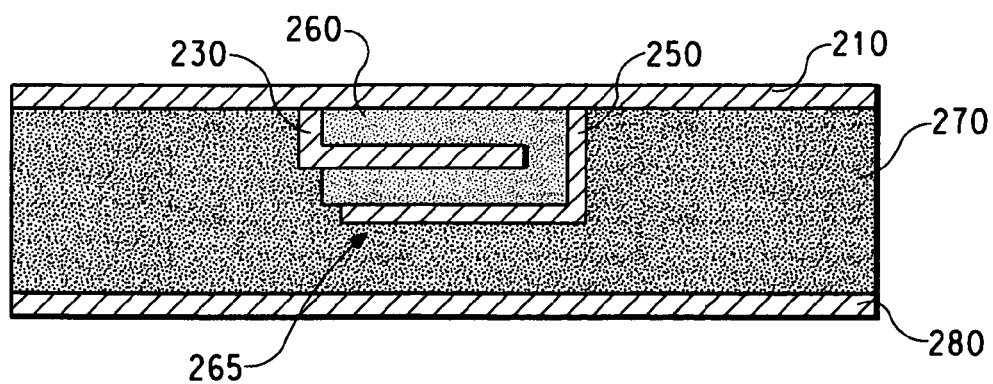

In FIG. 2I, the structure may be inverted and laminated. For example, the component face of the foil 210 can be laminated with laminate material 270. The lamination can be performed, for example, using FR4 prepreg in standard printing wiring board processes. In one embodiment, 106 epoxy prepreg may be used. Suitable lamination conditions are 185° C. at 208 psi for 1 hour in a vacuum chamber evacuated to 28 inches of mercury. A silicone rubber press pad and a smooth PTFE filled glass release sheet may be in contact with the foil 210 to prevent the epoxy from gluing the lamination plates together. A foil 280 may be applied to the laminate material 270 to provide a surface for creating circuitry. The embodiments of the capacitor structure 100 discussed above with reference to FIG. 1E may also be laminated in this manner. The dielectric prepreg and laminate materials can be any type of dielectric material such as, for example, standard epoxy, high Tg epoxy, polyimide, polytetrafluoroethylene, cyanate ester resins, filled resin systems, BT epoxy, and other resins and laminates that provide insulation between circuit layers.

Figure 2J:
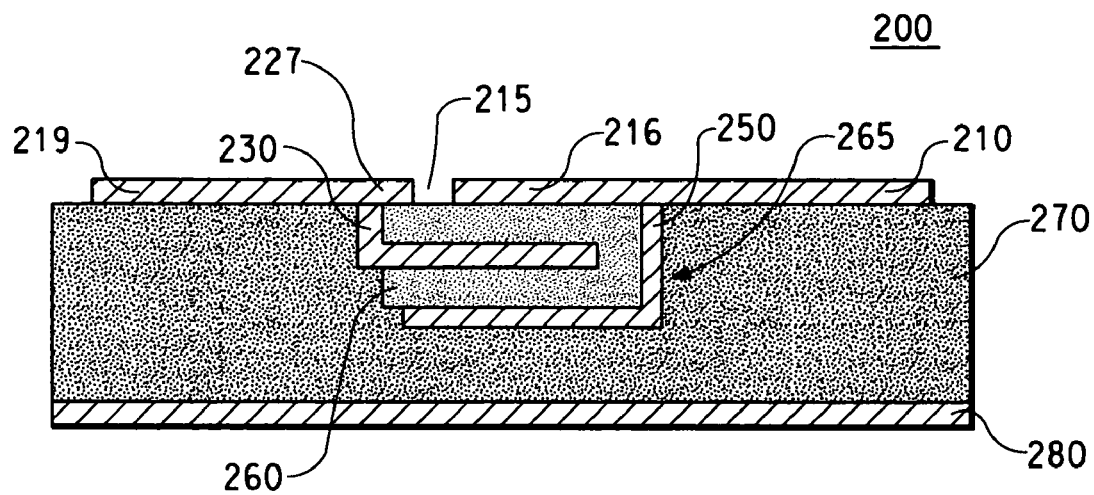
Figure 2K:
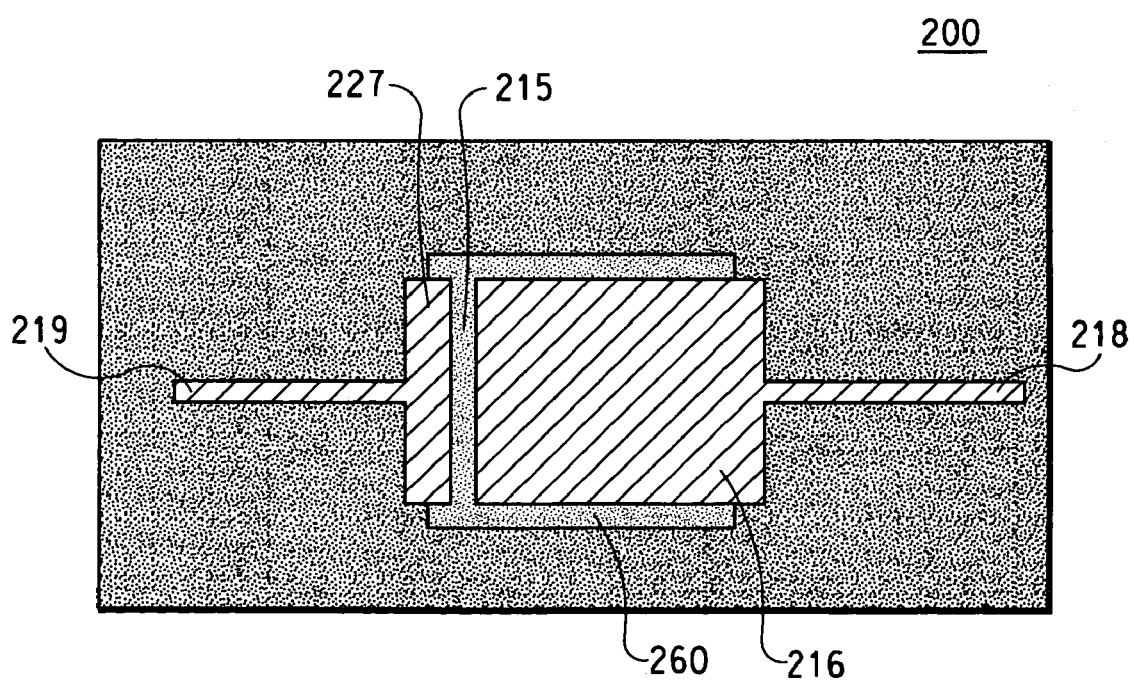
FIG. 2K is a top plan view of the second capacitor structure embodiment.

Referring to FIG. 2J, after lamination, a photo-resist is applied to the foil 210 and the foil 210 is imaged, etched and stripped using standard printing wiring board processing conditions. The etching produces a trench 215 in the foil 210, which breaks electrical contact between the first electrode 230 and the second electrode 250. FIG. 2K is a top plan view of the completed capacitor structure 200. A section 216 of the foil 210 is one electrode of the resulting capacitor structure 200, and may be connected to other circuitry by a conductive trace 218. A section 227 is coupled to the second electrode 230 and may be connected to other circuitry by a conductive trace 219.

The capacitor structure 200 discussed above has high capacitance density due to its two-layer capacitor structure. In addition, the capacitor structure 200 can be produced crack-free by co-firing of the dielectric layers and the electrodes.

Figure 3:
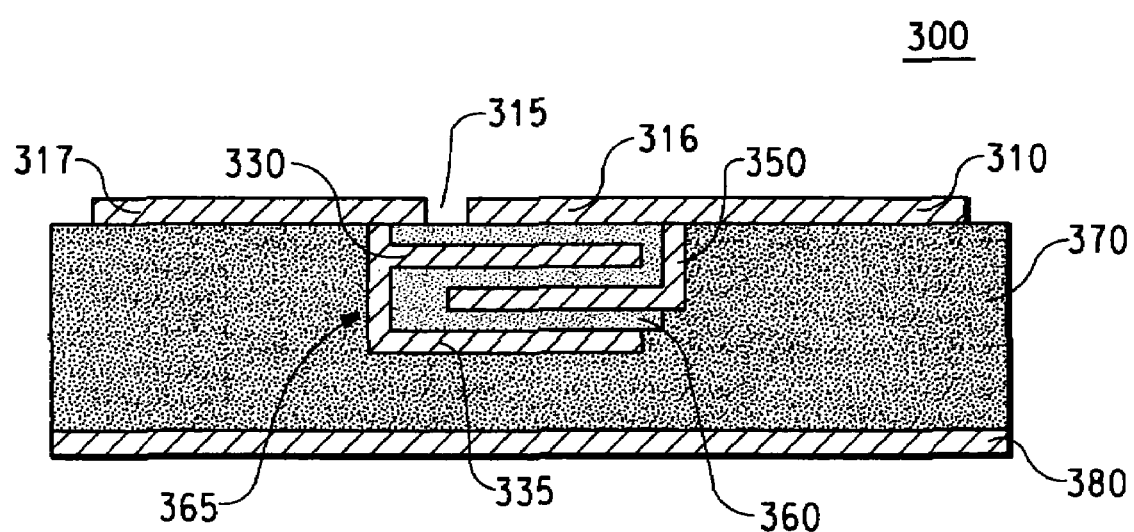
FIG. 3 illustrates a third embodiment of a capacitor structure.

FIG. 3 illustrates a third embodiment of a capacitor structure. The capacitor structure 300 is a three-layer embodiment having a high capacitance density. The capacitor structure 300 comprises a foil 310 and a plurality of dielectric/electrode stacks 365 (only one stack 365 is illustrated). The dielectric/electrode stack 365 include a first electrode 330 and a second electrode 350 separated by a dielectric 360, similar to the first and second electrodes 230, 250 of the capacitor structure 200 discussed above. Each dielectric/electrode stack 365 also has a third electrode 335 formed over the dielectric 360. A trench 315 breaks electrical contact of a portion 316 of the foil 310 and the electrode 350, from a portion 317 of the foil 310, the first electrode 330, and the third electrode 335. A laminate material 370 and a second foil 380 may be included in the capacitor structure 300.

The capacitor structure 300 can be manufactured in a manner similar to the capacitor structure 200. The third layer portion of the dielectrics 360 in the stacks 365 may be formed from one or more dielectric ink layers, as discussed above, and the electrodes 335 can be formed over the dielectrics 360.

The dielectric/electrode stacks 365 can be co-fired in three individual steps, or in a single step. Firing of each electrode/dielectric layer allows inspection of the product for defects. A single firing, however, reduces the cost of producing the capacitor structure 300.

The additional layer in the dielectric/electrode stacks 365 provides a high capacitance density for the capacitor structure 300. Co-firing of the dielectric layers and the electrode provides a low dissipation factor and crack-free structure.

In other embodiments, four or more layer capacitor structures can be produced by alternatively forming dielectric and electrode layers, and co-firing the layers.

In the embodiments discussed in this specification, the term "paste" may correspond to a conventional term used in the electronic materials industry, and generally refers to a thick-film composition. Typically, the metal component of the underprint paste is matched to the metal in the metal foil. For example, if a copper foil were used, then a copper paste could be used as the underprint. Examples of other applications would be pairing silver and nickel foils with a similar metal underprint paste. Thick film pastes may be used to form both the underprint and the passive components.

Generally, thick-film pastes comprise finely divided particles of ceramic, glass, metal or other solids dispersed in polymers dissolved in a mixture of plasticizer, dispersing agent and organic solvent. Preferred capacitor pastes for use on copper foil have an organic vehicle with good burnout in a nitrogen atmosphere. Such vehicles generally contain very small amounts of resin, such as high molecular weight ethyl cellulose, where only small amounts are necessary to generate a viscosity suitable for screen-printing. Additionally, an oxidizing component such as barium nitrate powder, blended into the dielectric powder mixture, helps the organic component burn out in the nitrogen atmosphere. Solids are mixed with an essentially inert liquid medium (the "vehicle"), then dispersed on a three-roll mill to form a paste-like composition suitable for screen-printing. Any essentially inert liquid may be used as the vehicle. For example, various organic liquids, with or without thickening and/or stabilizing agents and/or other common additives, may be used as the vehicle.

High K thick-film dielectric pastes generally contain at least one high K functional phase powder and at least one glass powder dispersed in a vehicle system composed of at least one resin and a solvent. The vehicle system is designed to be screen-printed to provide a dense and spatially well-defined film. The high K functional phase powders can comprise perovskite-type ferroelectric compositions with the general formula $ABO_3$. Examples of such compositions include $BaTiO_3$; $SrTiO_3$; $PbTiO_3$; $CaTiO_3$; $PbZrO_3$; $BaZrO_3$ and $SrZrO_3$. Other compositions are also possible by substitution of alternative elements into the A and/or B position, such as $Pb(Mg_{1/3}Nb_{2/3})O_3$ and $Pb(Zn_{1/3}Nb_{2/3})O_3$. $TiO_2$ and $SrBi_2Ta_2O_9$ are other possible high K materials.

Doped and mixed metal versions of the above compositions are also suitable. Doping and mixing is done primarily to achieve the necessary end-use property specifications such as, for example, the necessary temperature coefficient of capacitance (TCC) in order for the material to meet industry definitions, such as "X7R" or "Z5U" standards.

The glasses in the pastes can be, for example, Ca—Al borosilicates, Pb—Ba borosilicates, Mg—Al silicates, rare earth borates, and other similar glass compositions. High K glass-ceramic powders, such as lead germinate $(Pb_5Ge_3O_{11})$, are preferred.

Pastes used to form the electrode layers may be based on metallic powders of either copper, nickel, silver, silver-containing precious metal compositions, or mixtures of these compounds. Copper powder compositions are preferred.

The capacitor structure embodiments described in this specification have many applications. For example, the capacitor structure embodiments can be used within organic printed circuit boards, IC packages, applications of said structures in decoupling applications, and devices such as IC modules or handheld device motherboards.

In the above embodiments, the electrode layers are described as formed by screen-printing. Other methods, however, such as deposition by sputtering or evaporation of electrode metals onto the dielectric layer surface may also be used.

The foregoing description of the invention illustrates and describes the present invention. Additionally, the disclosure shows and describes only the preferred embodiments of the invention, but it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

EXAMPLES

Example 1

Referring to FIGS. 1A–1E, a specific embodiment of the capacitor structure 100 was described. In this embodiment, the foil 110 was a copper foil. The type of copper foil 110 can be any commercial grade of copper foil used in the printed wiring board industry, and may be in the range of ⅓ oz copper foil (approximately 12 microns thickness) to 1 oz copper foil (approximately 36 microns thickness). The copper foil 110 was pretreated by applying a copper underprint paste over selected areas of the foil 110. The resulting product was then fired in nitrogen at 900° C. for 10 minutes at peak temperature, with a total cycle time of approximately 1 hour, forming the underprint 112.

In FIG. 1B, a thick-film dielectric ink was screen-printed onto the pretreated copper foil 110 through 400 mesh screen to create a pattern of ½ inch by ½ inch first dielectric layers 120. The wet printed thickness of the first dielectric layers 120 is approximately 12–15 microns. The first dielectric layers 120 were dried at 125° C. for approximately 10 minutes, and second dielectric layers 125 were applied by screen-printing, followed by another drying step at 125° C. The thick-film dielectric ink included a barium titanate component, a zirconium oxide component, and a glass-ceramic phase.

Referring to FIG. 1C, thick-film copper electrode ink layers 130 was printed through 400 mesh screens onto the dielectric squares 120, and dried at 125° C. for approximately 10 minutes to form a 0.9 cm by 0.9 cm square electrode. In general, the printed electrode 130 thickness was limited only by the need for a pinhole-free film, and was typically in the range of 3 to 15 microns. The resulting structure was co-fired to 900° C. for 10 minutes at peak temperature using a thick film nitrogen profile. The nitrogen profile included less than 50 ppm oxygen in the burnout zone, and 2–10 ppm oxygen in the firing zone, with a total cycle time of 1 hour. Co-firing resulted in the dielectric/electrode stacks 140 illustrated in FIG. 1E.

In this example, the thick film dielectric material had the following composition:

| | |
|---|---|
| Barium titanate powder | 64.18% |
| Zirconium oxide powder | 3.78% |
| Glass A | 11.63% |
| Ethyl cellulose | 0.86% |
| Texanol | 18.21% |
| Barium nitrate powder | 0.84% |
| Phosphate wetting agent | 0.5%. |

Glass A comprised:

| | |
|---|---|
| Germanium oxide | 21.5% |
| Lead tetraoxide | 78.5%. |

The Glass A composition corresponded to $Pb_5Ge_3O_{11}$, which precipitated out during the firing, and had a dielectric constant of approximately 70–150. The thick film copper electrode ink comprised:

| | |
|---|---|
| Copper powder | 55.1% |
| Glass A | 1.6% |
| Cuprous oxide powder | 5.6% |
| Ethyl cellulose T-200 | 1.7% |
| Texanol | 36.0%. |

After firing, the capacitor structure was crack free and had the following electrical characteristics:

| | |
|---|---|
| capacitance density | approximately 150 nF/in$^2$ |
| dissipation factor | approximately 1.5% |
| insulation resistance | >5 × 10$^9$ Ohms |
| breakdown voltage | approximately 800 volts/mil. |

In this example, the use of copper as the material to form the foil 110 and the electrodes 130 was advantageous because copper was not subject to a large degree of migration. In conventional, separately fired-on-foil methods, the large TCE difference between copper and dielectric materials leads to cracking and separation of the electrode from the dielectric, and high dissipation factors. However, by co-firing the electrodes and dielectrics, cracking did not occur and low dissipation factors were achieved.

Example 2

A process as described in Example 1 was repeated, except that the thick-film dielectric 128 was printed through 325 mesh screen, with a wet thickness of each of the two layers of approximately 15–20 microns. Results were similar to the embodiment of Example 1, except that the capacitance density was approximately 120 nF/inch$^2$.

Example 3

A process as described in Example 2 was repeated using a variety of dielectric and electrode dimensions shown in the table below:

| Dielectric Size mils | Electrode Size mils |
|---|---|
| 250 × 250 | 210 × 210 |
| 56 × 340 | 40 × 320 |
| 176 × 340 | 160 × 320 |
| 96 × 180 | 80 × 158 |
| 26 × 180 | 10 × 159 |
| 176 × 180 | 160 × 158 |
| 36 × 98 | 20 × 77 |
| 56 × 100 | 40 × 78 |
| 176 × 100 | 160 × 78 |
| 36 × 58 | 20 × 37 |
| 96 × 60 | 80 × 38 |
| 36 × 38 | 16 × 17 |
| 26 × 30 | 10 × 9 |
| 26 × 340 | 10 × 318 |
| 90 × 90 | 70 × 70 |
| 330 × 330 | 310 × 310 |
| 119.5 × 119.5 | 109.5 × 109.5 |
| 36 × 338 | 20 × 320 |
| 96 × 340 | 80 × 320 |
| 36 × 178 | 20 × 157 |
| 336 × 180 | 320 × 158 |
| 56 × 180 | 40 × 158 |

-continued

| Dielectric Size mils | Electrode Size mils |
|---|---|
| 26 × 100 | 10 × 74 |
| 56 × 100 | 40 × 78 |
| 96 × 100 | 80 × 78 |
| 26 × 60 | 10 × 39 |
| 56 × 60 | 40 × 38 |
| 26 × 40 | 10 × 18 |
| 56 × 40 | 40 × 18 |
| 36 × 28 | 20 × 7 |
| 336 × 340 | 320 × 318 |
| 170 × 170 | 150 × 150 |
| 240 × 240 | 229.5 × 229.5 |

Capacitance in these embodiments was proportional to the area of the printed copper electrode, but the calculated capacitance densities were essentially identical to that of Example 1.

What is claimed is:

1. A capacitor structure, comprising:
a metallic foil;
at least one dielectric layer disposed over a portion of the foil; and
at least one first electrode disposed over a portion of the dielectric layer;
wherein upon cofiring the at least one dielectric layer with the at least one first electrode, the at least one dielectric layer exhibits a high dielectric constant, and the foil, the at least one dielectric layer and the at least one first electrode form a high capacitance capacitor.

2. The capacitor structure of claim 1, wherein the metallic foil and the at least one first electrode comprises copper.

3. The capacitor structure of claim 1, wherein the at least one dielectric layer comprises a high K glass and barium titanate.

4. The capacitor structure of claim 3, wherein the at least one dielectric layer further comprises zirconium oxide.

5. The capacitor structure of claim 1, incorporated into a device.

6. A multi-layer capacitor structure, comprising:
a metallic foil;
a first dielectric layer disposed over a portion of the foil;
a first electrode disposed over a portion of to dielectric layer and a portion of the foil;
a second dielectric layer disposed over a portion of the first dielectric layer and the first electrode; and
at least one second electrode disposed over a portion of the second dielectric layer and over a portion of the foil, wherein, upon cofiring the first and second dielectric layers with the first and second electrodes, and after etching the foil to form a trench, the dielectric exhibits a high dielectric constant and the foil, the first and second dielectric layers and the first and second electrodes form a high capacitance capacitor.

7. The capacitor structure of claim 6, wherein the first dielectric layer and the first electrode are cofired prior to the addition of the second dielectric layer and the second electrode.

8. The capacitor structure of claim 6, wherein the dielectric layer comprises a high K glass and barium titanate.

9. The capacitor structure of claim 8, wherein the dielectric layer further comprises zirconium oxide.

10. The capacitor structure of claim 6, wherein the metallic foil and the first electrode comprise copper.

11. The capacitor structure of claim 10, wherein the second electrode comprises copper.

12. The capacitor structure of claim 6, further comprising a third electrode formed over a portion of the second dielectric layer.

13. The capacitor structure of claim 6, incorporated into a device.

* * * * *